(12) United States Patent
Barabi et al.

(10) Patent No.: US 7,651,340 B2
(45) Date of Patent: Jan. 26, 2010

(54) CHIP ACTUATOR COVER ASSEMBLY

(75) Inventors: Nasser Barabi, Lafayette, CA (US);
Oksana Kryachek, San Francisco, CA (US); Chee-Wah Ho, Fremont, CA (US)

(73) Assignee: Essai, Inc., Fremont, CA (US)

( * ) Notice: Subject to any disclaimer, the term of this patent is extended or adjusted under 35 U.S.C. 154(b) by 0 days.

(21) Appl. No.: 12/072,121

(22) Filed: Feb. 22, 2008

(65) Prior Publication Data

US 2008/0207037 A1 Aug. 28, 2008

Related U.S. Application Data

(60) Provisional application No. 60/903,161, filed on Feb. 23, 2007.

(51) Int. Cl.
*H01R 12/00* (2006.01)

(52) U.S. Cl. ....................................... 439/73

(58) Field of Classification Search ............. 439/71–73, 439/70, 330, 331; 324/755
See application file for complete search history.

(56) References Cited

U.S. PATENT DOCUMENTS

| | | | |
|---|---|---|---|
| 5,086,269 A | 2/1992 | Nobi | |
| 5,127,837 A | 7/1992 | Shah et al. | |
| 5,387,120 A | 2/1995 | Marks et al. | |
| 5,647,756 A | 7/1997 | Twigg et al. | |
| 5,688,128 A | 11/1997 | Ikeya | |
| 5,924,183 A | 7/1999 | Kelley et al. | |
| 6,297,654 B1 * | 10/2001 | Barabi | 324/755 |
| 6,354,859 B1 * | 3/2002 | Barabi et al. | 439/331 |
| 6,559,665 B1 | 5/2003 | Barabi | |
| 7,195,507 B2 * | 3/2007 | Watanabe | 439/331 |
| 7,411,794 B2 * | 8/2008 | Wakabayashi et al. | 361/752 |
| 2003/0181076 A1 * | 9/2003 | Kanesashi | 439/73 |

* cited by examiner

*Primary Examiner*—Alexander Gilman
(74) *Attorney, Agent, or Firm*—Donald L. Beeson; Beeson Skinner Beverly

(57) ABSTRACT

An improved IC chip actuator cover assembly for an IC socket includes a pedestal assembly spring-mounted to the bottom of a carrier housing and side leaf springs or other similar force transferring means on the pedestal assembly which transmit a z-axis force to the corner regions of the pedestal assembly for advancing the pedestal assembly in the z-axis direction against an IC chip in the IC socket. The compliance of the leaf springs maintains a constant and precise actuating force on the IC chip when the IC chip is contacted by the pusher end portion or portions of the pedestal assembly. In a preferred aspect of the invention, the front, back, and sides of the carrier housing define a central cavity region above the pedestal assembly for permitting air flow through the carrier housing to improve the heat dissipation capability of the cover assembly.

29 Claims, 16 Drawing Sheets

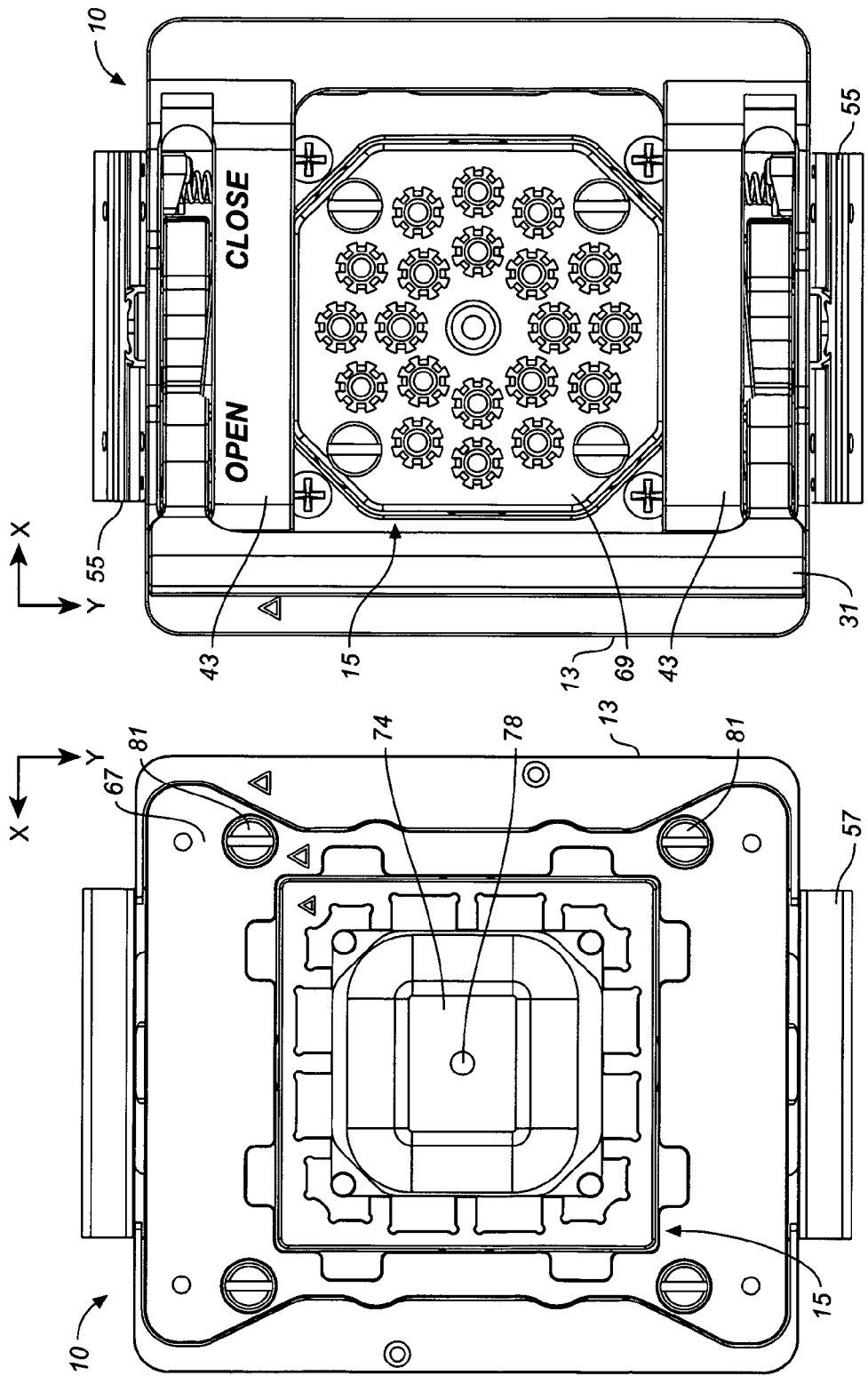

CHIP ACTUATOR COVER ASSEMBLY

CROSS-REFERENCE TO RELATED APPLICATIONS

This application claims the benefit of U.S. provisional application Ser. No. 60/903,161 filed Feb. 23, 2007, now pending, the entirely of which is incorporated herein by reference.

BACKGROUND OF THE INVENTION

The present invention generally relates to sockets for integrated circuit (IC) devices, and, more particularly, to the construction of covers for IC sockets which hold IC chips in electrical contact with the pin array of the socket.

Sockets for holding IC chip packages are widely known and used in a variety of industrial applications for achieving efficient electrical contact between the I/O contact array of an IC device and the conductor pads of a circuit board. Such applications include test sockets for mounting a device under test (DUT) to a test board and contactor sockets for removably mounting an IC device to a printed circuit board. The socket functions to precisely position the IC device over the pin array of a test or contactor socket, such that all of the I/O contacts of the device make efficient electrical contact with the socket's pin array.

Socket covers have been devised for depressing the IC chip package in the socket and against the socket's pin array in a controlled z-axis movement. One such cover is disclosed in U.S. Pat. No. 6,354,859, wherein the cover for the IC socket includes a lid that closes over the top of the socket and a threaded depressor element in the center of the lid. When placed over the socket, the lid's depressor element is advanced by screwing it down in the z-axis direction against an IC chip package so as to press against the top of the package. The difficulty with such prior socket cover designs is that the threaded depressor construction is relatively rigid and bulky, and involves frictional forces that impair the ability of the depressor to provide a precise and uniform actuating force. The bulky lid and depressor construction also limits the ability of the socket cover to carry away heat generated within the IC chip.

A need therefore exists for an IC socket cover design capable of producing and maintaining precise actuating forces on an IC chip package and capable of efficiently dissipating heat produced by the chip.

SUMMARY OF THE INVENTION

The various aspects of the present invention provide several advantages over prior art socket cover designs. First, the invention can provide an IC chip actuator cover assembly for an IC socket with improved heat dissipation capabilities. It can also provide an IC chip actuator cover assembly capable of producing balanced and precise z-axis actuating forces, as well as a cover assembly that can be readily designed to meet different actuating force requirements. The chip actuator cover assembly of the invention is particularly adapted for use with IC chip packages having relatively high pin counts and high power requirements.

Briefly, the IC chip actuator cover assembly of the invention is comprised of the following basic components: 1) an actuator mechanism, preferably having spread-apart actuating members, for producing an actuating force, 2) a carrier housing for the actuator mechanism, and 3) a pedestal assembly mounted, and preferably spring-mounted, to the bottom of the carrier housing. The actuating members of the actuator mechanism are preferably deployed at the sides of the carrier housing to produce actuating forces through the sides of the carrier housing rather than through the center of the housing, as in conventional actuator designs.

The chip actuating force on the IC chip is produced through the pedestal assembly, which preferably has side leaf springs (or other similar force transferring means) and at least one bottom pusher end portion. The side leaf springs extend between opposed corner regions of the pedestal assembly, and are deployed beneath the actuating members of the actuator mechanism held in the carrier housing such that, when an actuating force is produced by the actuating members, a z-axis force is exerted against the leaf springs. This z-axis force is transmitted by the leaf springs to the corner regions of the pedestal assembly for advancing the pedestal assembly in the z-axis direction. The compliance of the leaf springs will maintain a constant and precise actuating force on the IC chip when the IC chip is contacted by the pusher end portion or portions of the pedestal assembly. Suitable actuating forces can be produced in this fashion with very little deflection of the leaf springs and very little travel of the pedestal assembly. Leaf spring deflections on the order of 50 mils are contemplated.

In one preferred aspect of the invention, the front, back, and sides of the carrier housing define a central cavity region above the pedestal assembly for permitting air flow through the carrier housing to improve the heat dissipation capability of the cover assembly. This open cavity region will in turn permit one or more cooling pillars, or similar heat dissipating structures, to be accommodated on top of the pedestal assembly. Air flow openings can suitably be provided in the carrier housing to increase air flow through its central cavity region.

In another aspect of the invention, the pedestal assembly is comprised of an outer pedestal frame and an inner pedestal heat sink mounted to the pedestal frame. The pedestal heat sink has a bottom pusher end, and is preferably spring-mounted to the outer pedestal frame to permit the z-axis reactive force exerted by a contacted IC chip on the pedestal heat sink to be taken up by the pedestal heat sink. Spring-mounting of the pedestal heat sink in the pedestal frame will also allow pre-loading of the pedestal heat sink in bare die chip package applications, where a pusher element for the chip substrate is also used.

Other aspects of the invention will be apparent from the following specification and claims.

DESCRIPTION OF THE DRAWINGS

FIG. 3 is a bottom plan view thereof.

FIG. 4 is a top plan view thereof.

DETAILED DESCRIPTION OF THE ILLUSTRATED EMBODIMENT

Figure 10:
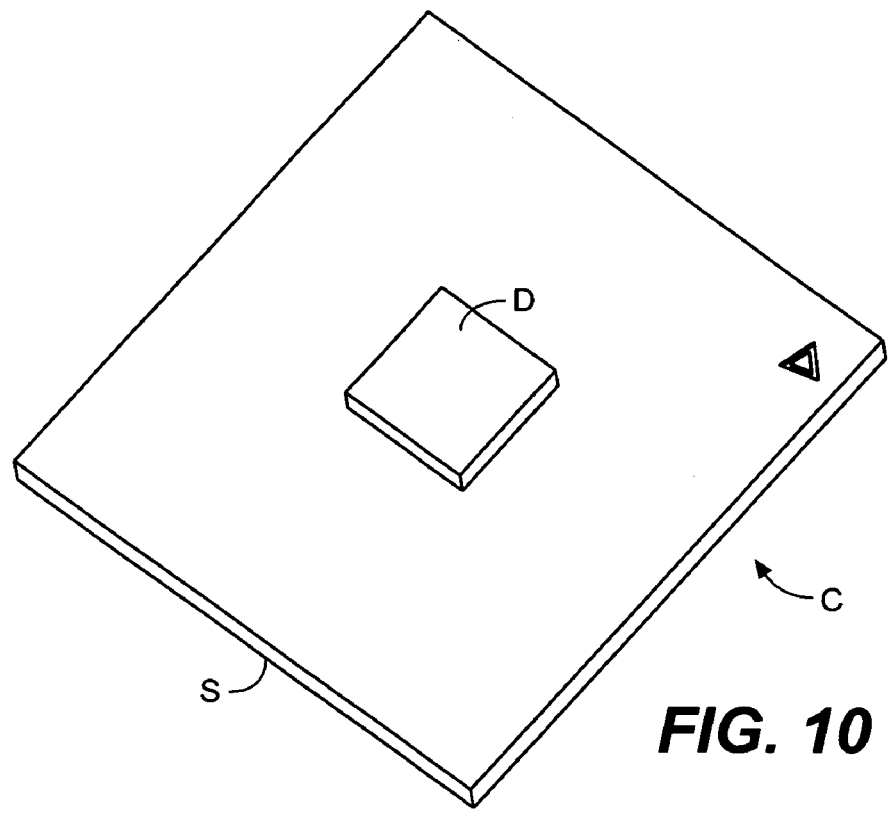
FIG. 10 is a graphic representation of the top of a bare die IC chip package.
Figure 11:
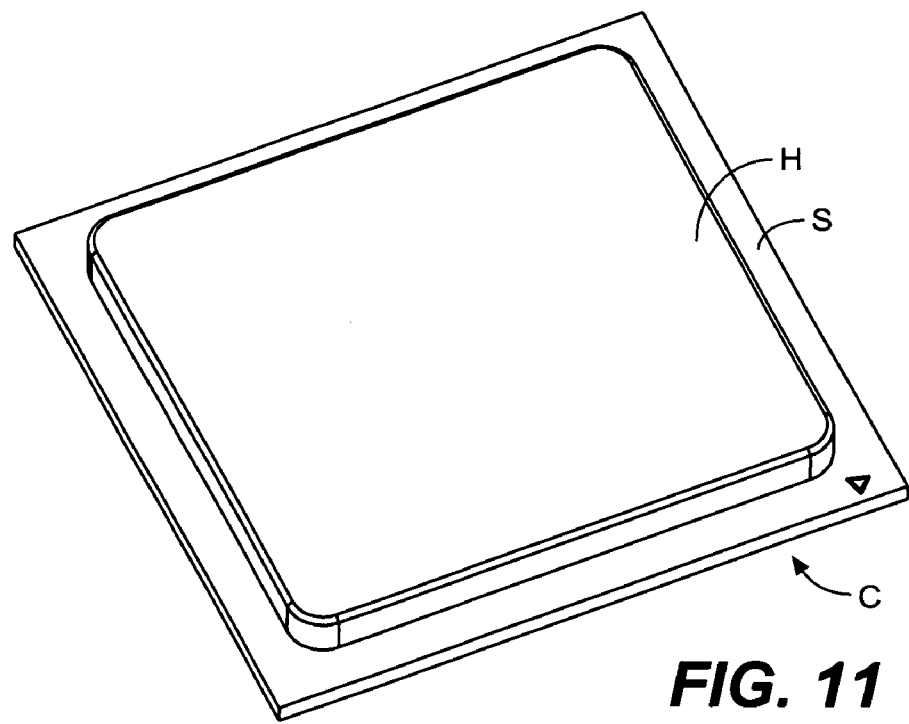
FIG. 11 is a graphic representation of the top of an IHS chip package.
Figure 12:
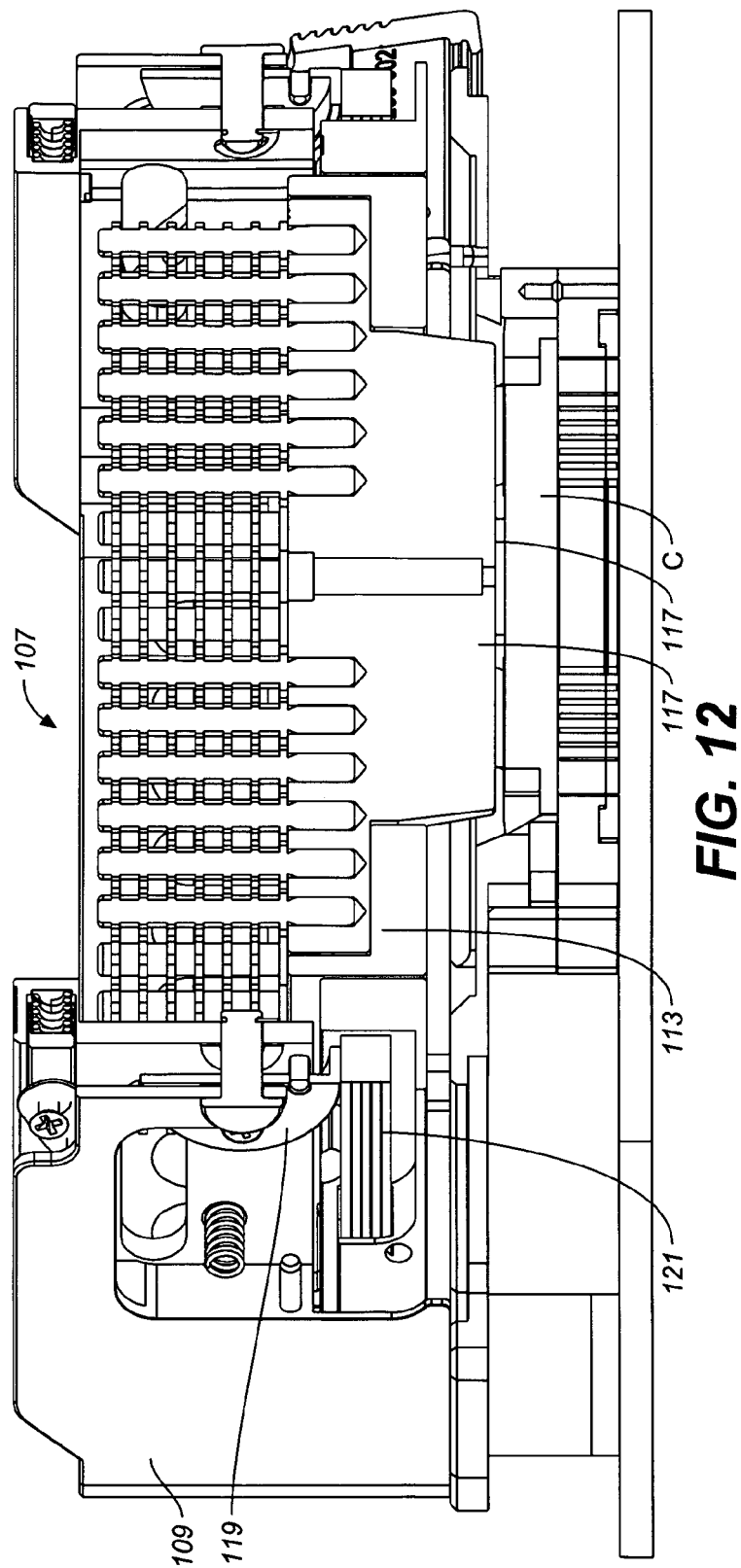
FIG. 12 is a cross-sectional view in side elevation of another embodiment of an IC chip actuator cover assembly in accordance with the invention, with the chip actuator cover assembly shown at an angle. (The cross-section is taken along section lines 12-12 in FIG. 17.)
Figure 13:
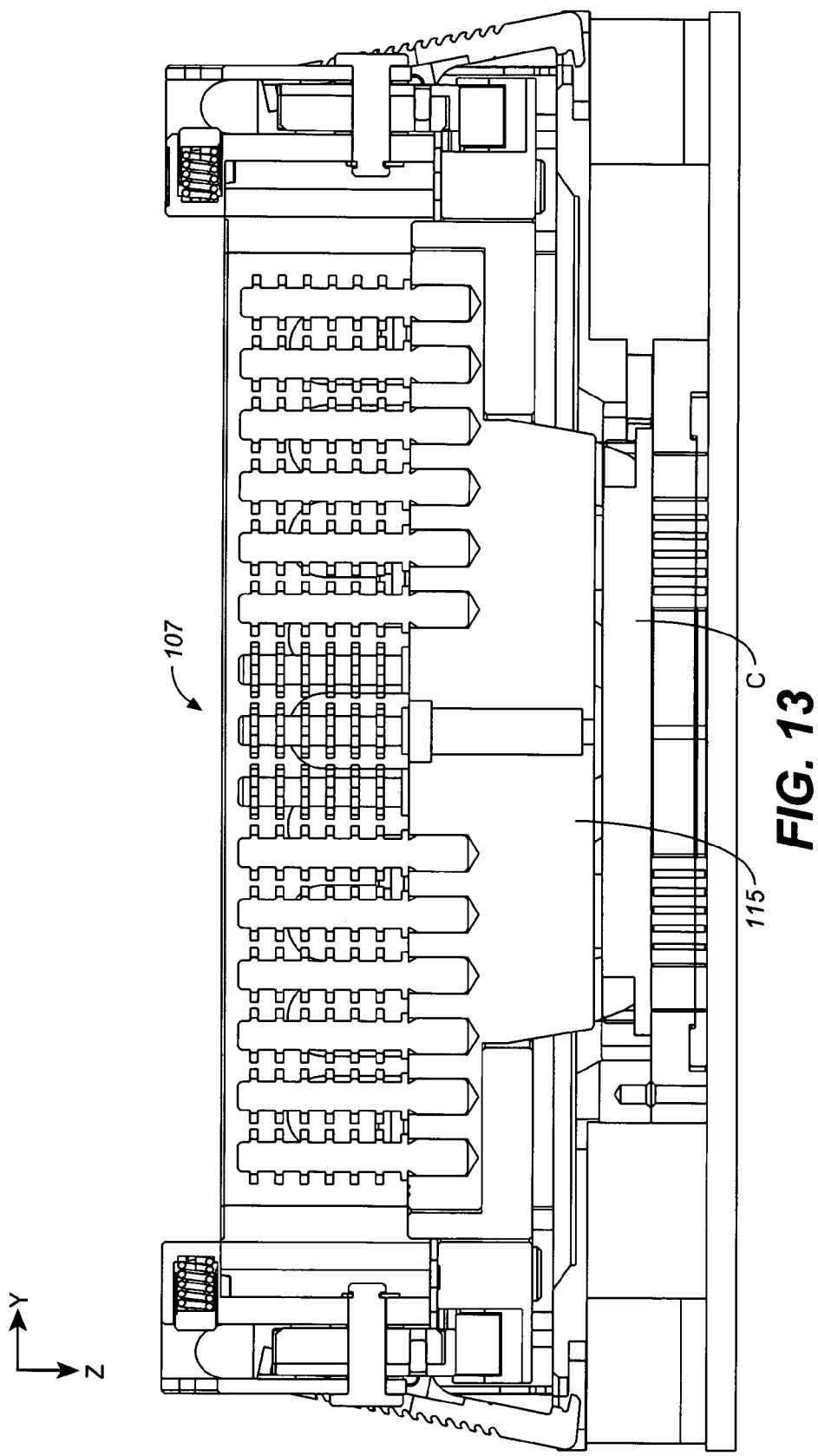
FIG. 13 is another cross-sectional view thereof, with the actuator mechanism in an open position. (The cross-section is taken along section lines 13-13 in FIG. 17.)
Figure 14:
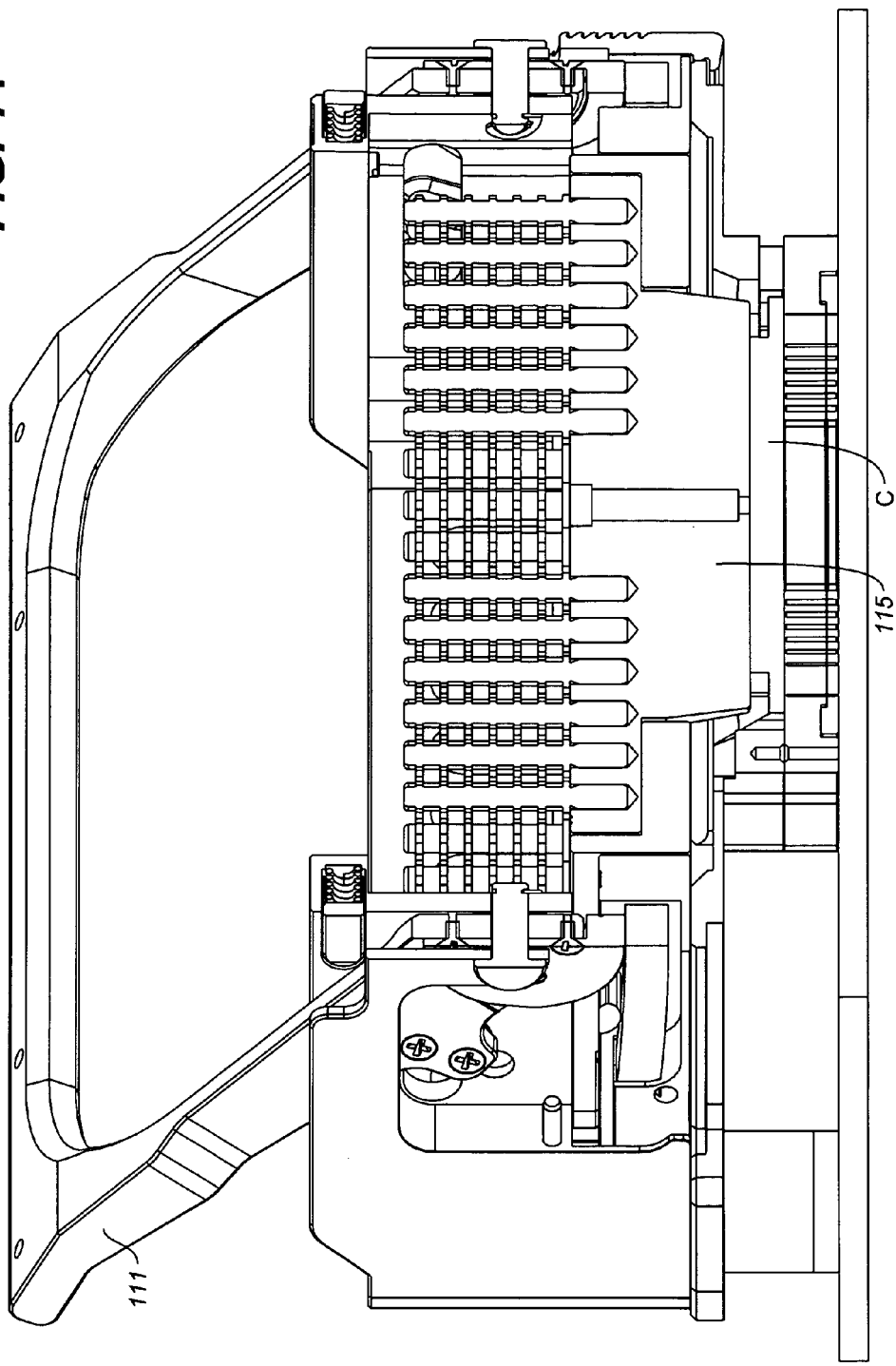
FIG. 14 is the same cross-sectional view shown in FIG. 12 showing the actuator handle in a partially closed position.
Figure 15:
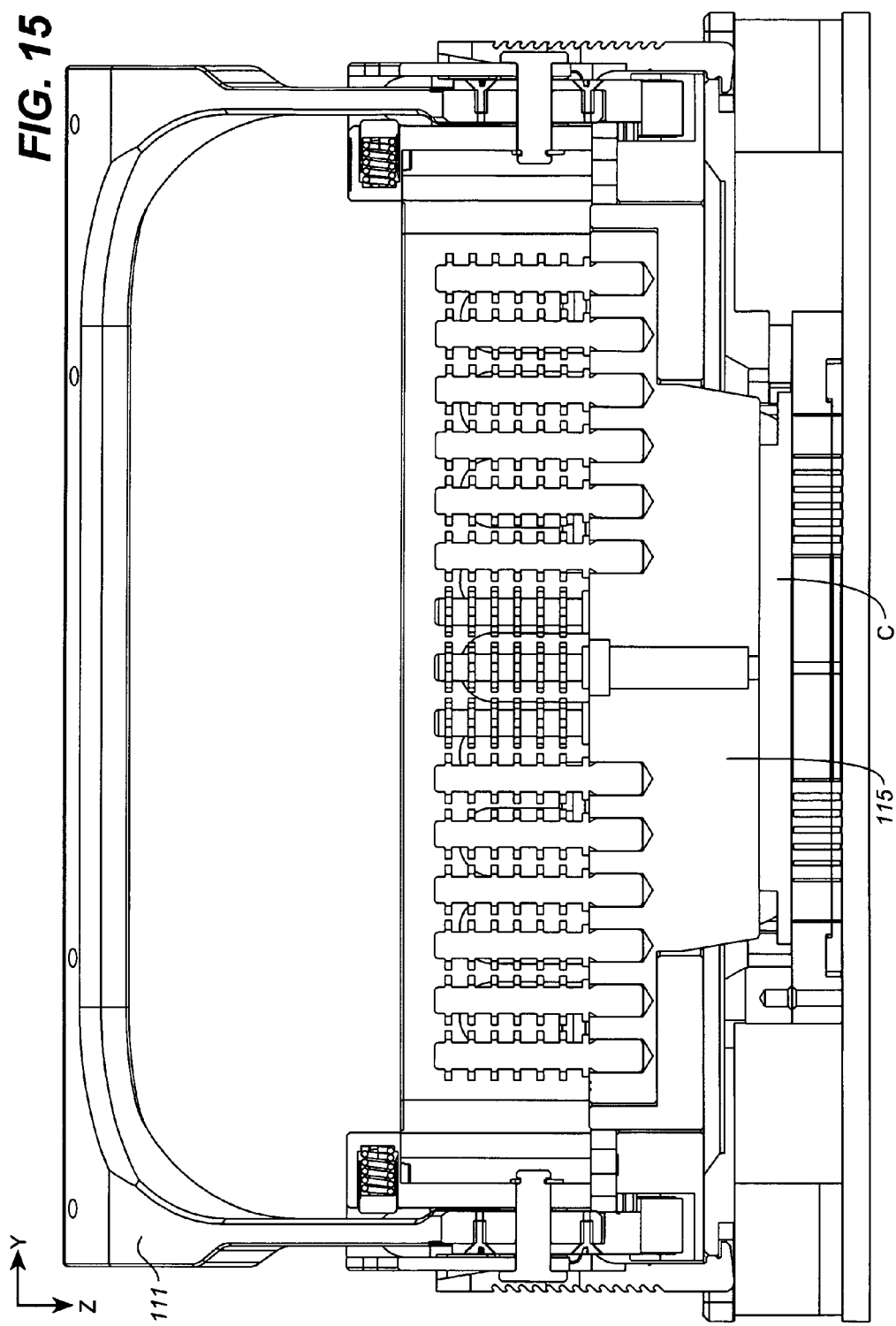
FIG. 15 is the same cross-sectional view shown in FIG. 13 with the actuator mechanism in a partially closed position.

The accompanying drawings illustrate two possible versions of an IC chip actuator cover assembly in accordance with the present invention. FIGS. 1-9A illustrate a version adapted for use with a relatively low profile bare die chip package such as graphically illustrated in FIG. 10, whereas FIGS. 12-16 illustrate an embodiment of the chip actuator cover assembly adapted for use with IHS (integrated heat spreader) chip packages, such as illustrated in FIG. 11, having a relatively large heat spreader body surrounding a silicon chip. It is understood that other configurations of the chip actuator cover assembly of the invention can be devised for particular applications.

Turning to the embodiment illustrated in FIGS. 1-9A, the chip actuator cover assembly generally denoted by the numeral 10 has an actuator mechanism 11, a carrier housing 13 for the actuator mechanism, and a pedestal assembly 15. The carrier housing is generally defined by a top 17, a bottom 19, a front 21, a back 23, and two sides 25, all of which define a central cavity region 27 within the carrier housing through which air can be circulated. Air circulation through this central cavity region is promoted by air flow openings 29 in the front and back of the carrier housing.

The actuator mechanism 11 carried by carrier housing 13 includes an accessible actuator handle 31, which extends across the top of the carrier housing, and which is connected by side arms 33 to actuating members in the form of cam discs 35. The cam discs 35 are disposed at the sides of the carrier housing, and, together with the lower ends of the actuator mechanism's side arms 33, are rotatably connected to the sides of the carrier housing by pivot pins 37. The cam discs and connector arms are pinned to narrow center wall portions 39 that extend down into cutouts 41 in the carrier housing sides. These side cutouts accommodate the spring clips 55 described below and provide for additional beneficial air circulation within the carrier housing.

Figure 9:
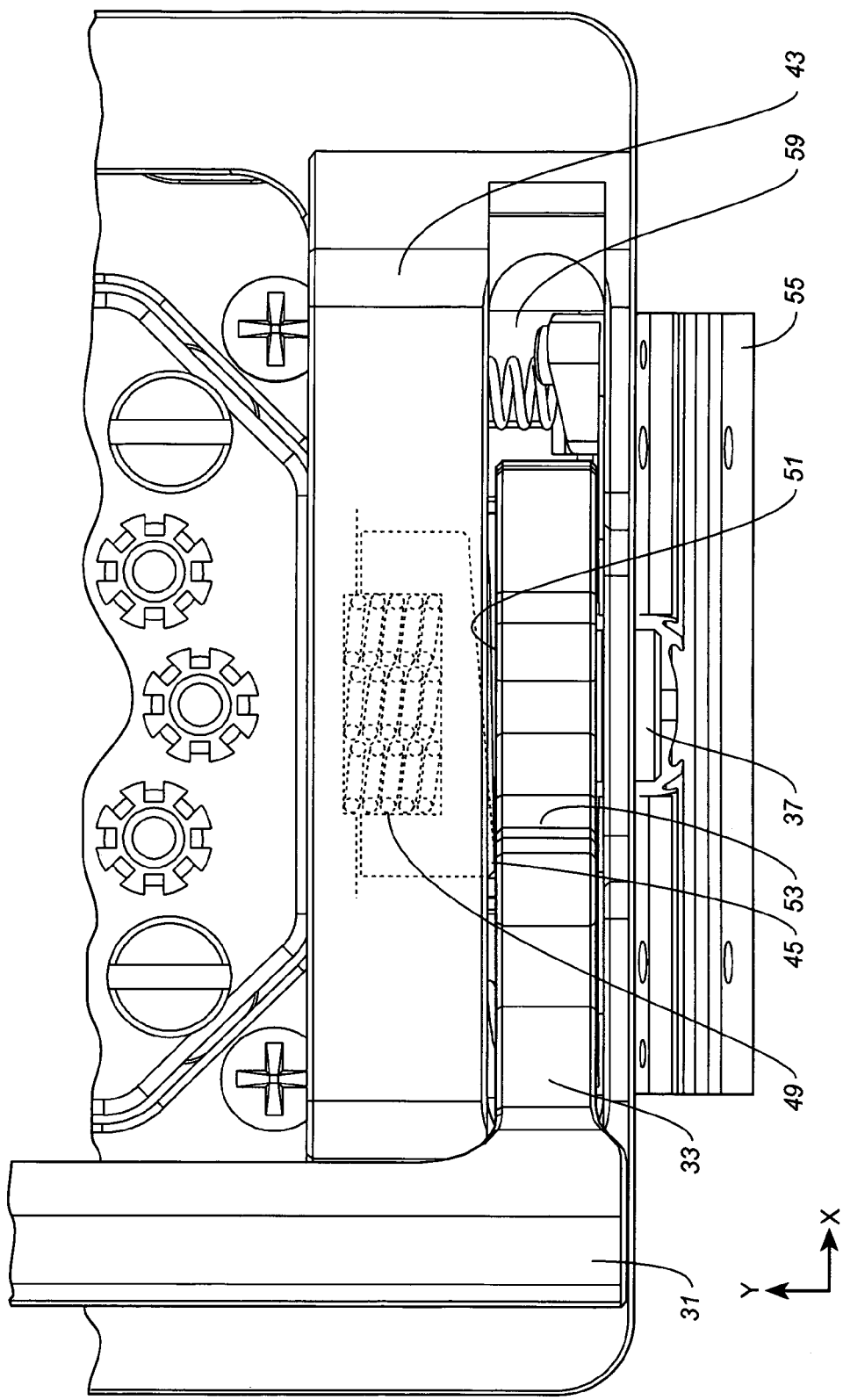
FIG. 9 is a fragmentary top plan view of the chip actuator cover assembly illustrated in the foregoing figures showing the handle in the open position.
Figure 9A:
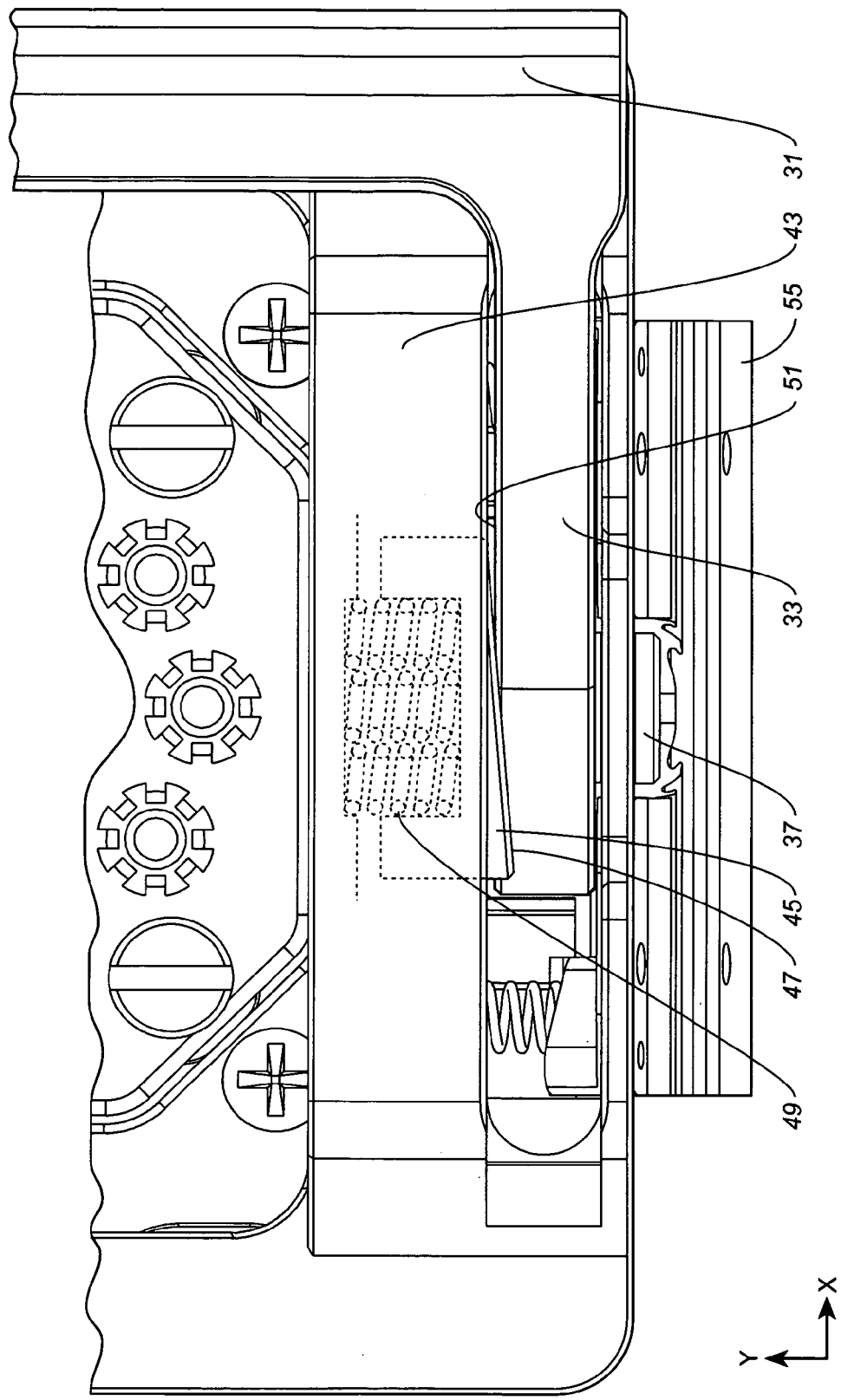
FIG. 9A is a fragmentary top plan view thereof showing the actuator handle in a closed position.

It is further seen that the connecting arms 33 of the actuator mechanism are supported adjacent parallel cross-pieces 43 extending between the front and back of the carrier housing inside of the carrier housing side walls. As best shown in FIGS. 9 and 9A, each of the cross-pieces 43 contains a breaking pad 45 having an angled cam surface 47. These breaking pads are spring-loaded by compression springs 49 to engage the inner side wall 51 of the actuator connector arms as the actuator handle is moved to a closed position. A raised portion 53 on the of the connector arms will keep the breaking pads 45 depressed when the handle is in an open position as shown in FIG. 9. When the actuator handle is moved to the closed position as shown in FIG. 9A, the braking pad will extend and will act to retard any tendency of the handle to return toward its open position.

The carrier housing further includes side clips 55 having lower extended ends 57 for engaging an IC socket. These side clips, which are retained in a closed position by retention springs 59, are rotatably pinned to the sides of the carrier housing by threaded lag pins 63, which slide through corner holes 65 in the carrier housing and screw into threaded holes 66 in the edges of the side clips. Center cutouts 61 are suitably provided in the side clips for accommodating the pivot pins 37 for the actuator mechanism.

The pedestal assembly 15, which is mounted to the bottom of the carrier housing as hereinafter described, is comprised of an outer pedestal frame 67, a pedestal heat sink 69 supported within the frame 67, side leaf springs 71, and a pusher frame 73 affixed to the bottom of the pedestal frame by means of Phillips head screws 75. The pedestal heat sink has a downwardly extending pusher end 74, which cooperates with the pusher frame 73 to push against a bare die chip package in an IC socket. The pedestal heat sink is spring-mounted to the outer pedestal frame by means of spring-loaded shoulder screws 79, which allow z-axis movement of the pedestal heat sink relative to the outer frame. This spring mounting will allow the z-axis reactive force exerted by a contacted IC chip to be taken up by the pedestal heat sink as the pedestal heat sink advances onto the bare silicon die D of a bare die chip package C shown in FIG. 10. The pusher frame is provided to push against the substrate S of the bare die chip package, and is sized to do so only slightly after the pusher end of the pedestal heat sink contacts the bare silicon, where most of the heat is generated. The pusher end of the pedestal heat sink suitably leads the pusher end of the pusher frame by about 0.015 inches. Too great a difference will distort the IC chip. This small lead will allow a firm and uniform contact to be made with the bare die D of the bare die chip package for maximum heat transfer. It is noted that a heat sensor can suitably be embedded in the pedestal heat sink to monitor the temperature of the IC chip. The presence of such a heat sensor is denoted by dashed lines 77 in FIGS. 3, 7, 7A, and 8. As best seen in FIG. 3, a thermal couple opening 78 is provided in the bottom of the pedestal heat sink for the heat sensor.

Figure 1:
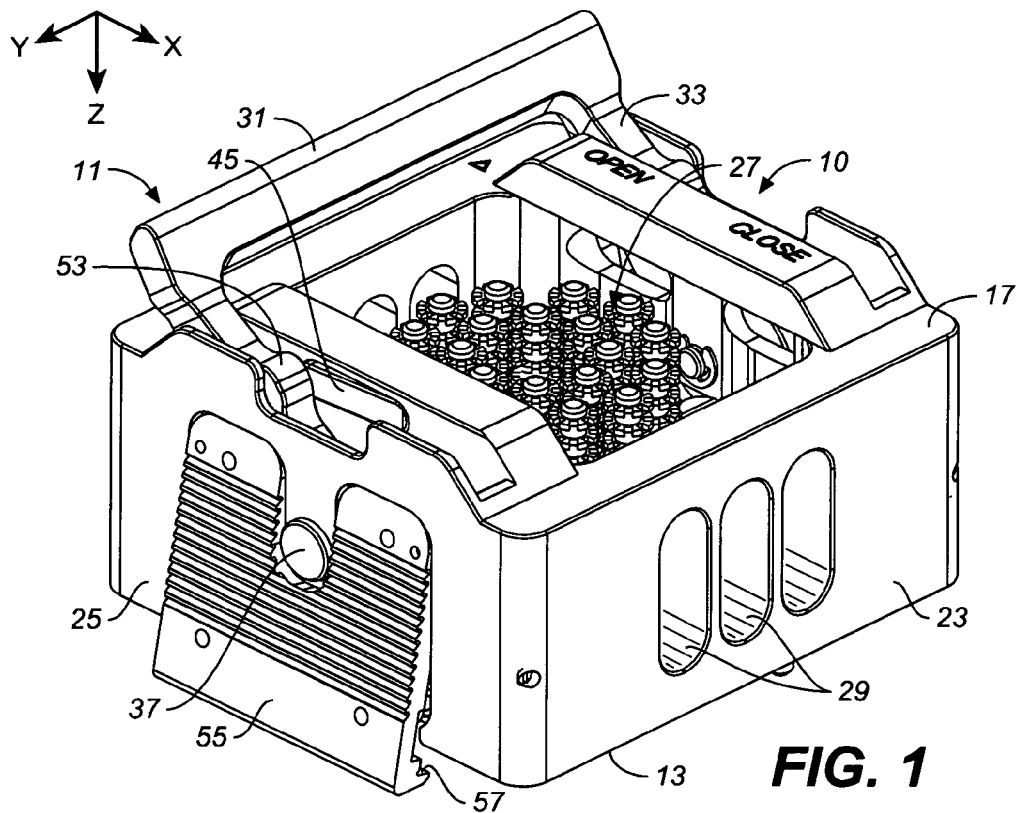
FIG. 1 is a top perspective view of an IC chip actuator cover assembly in accordance with the invention.
Figure 2:
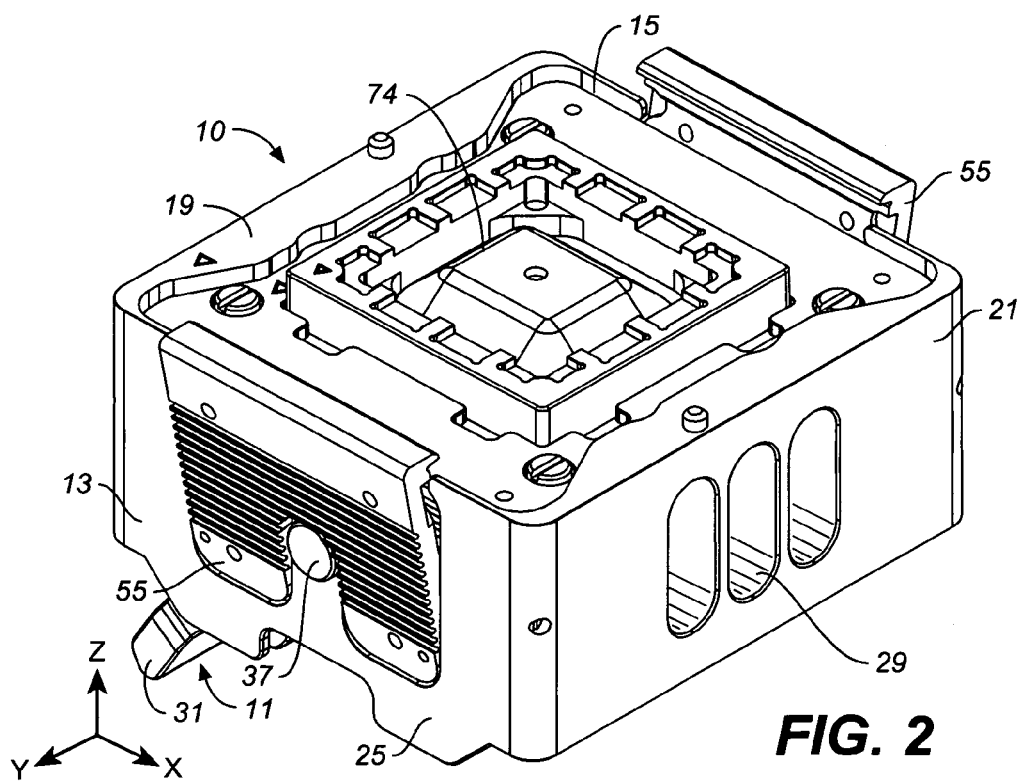
FIG. 2 is a bottom perspective view thereof.
Figure 5:
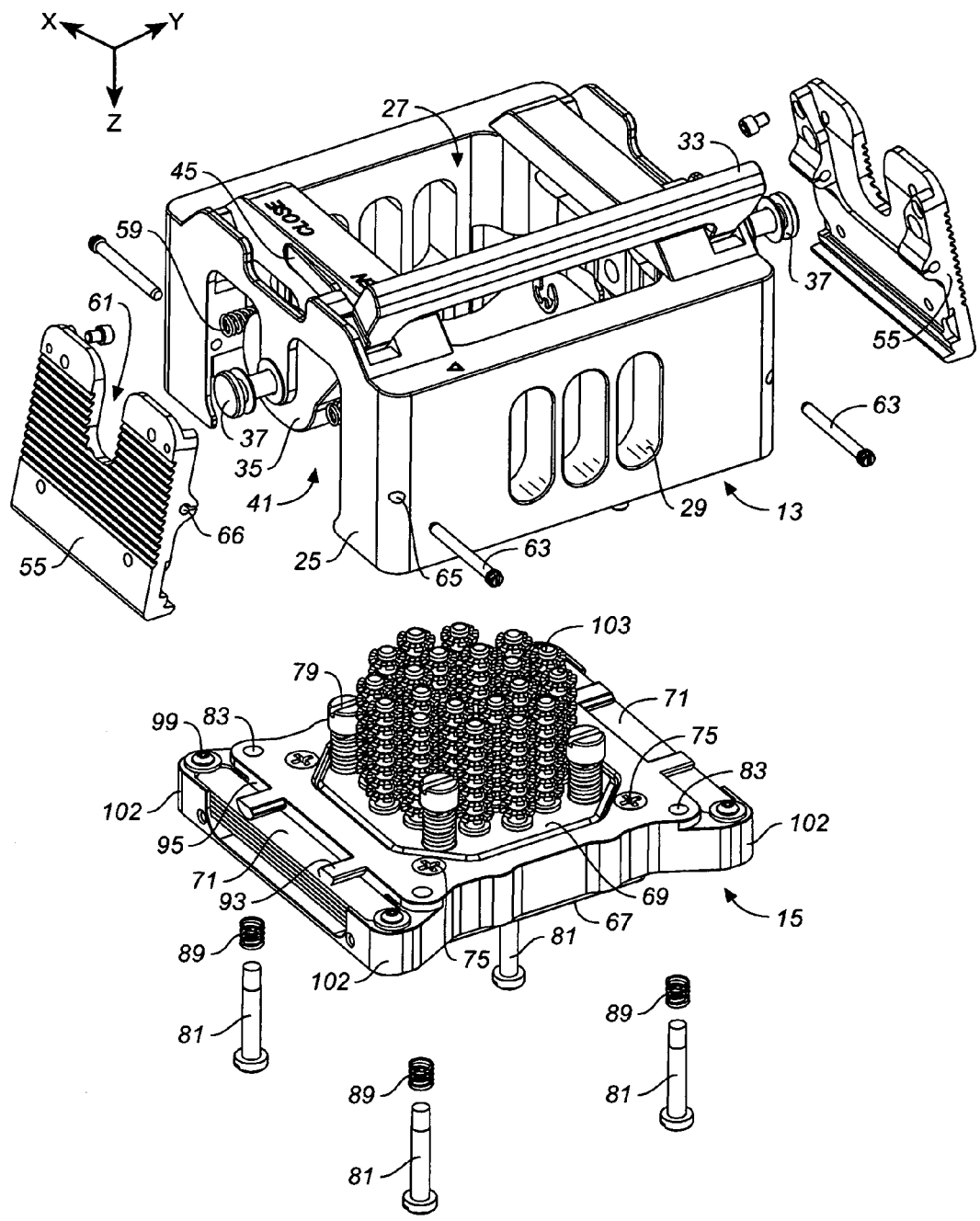
FIG. 5 is an exploded view thereof.
Figure 6:
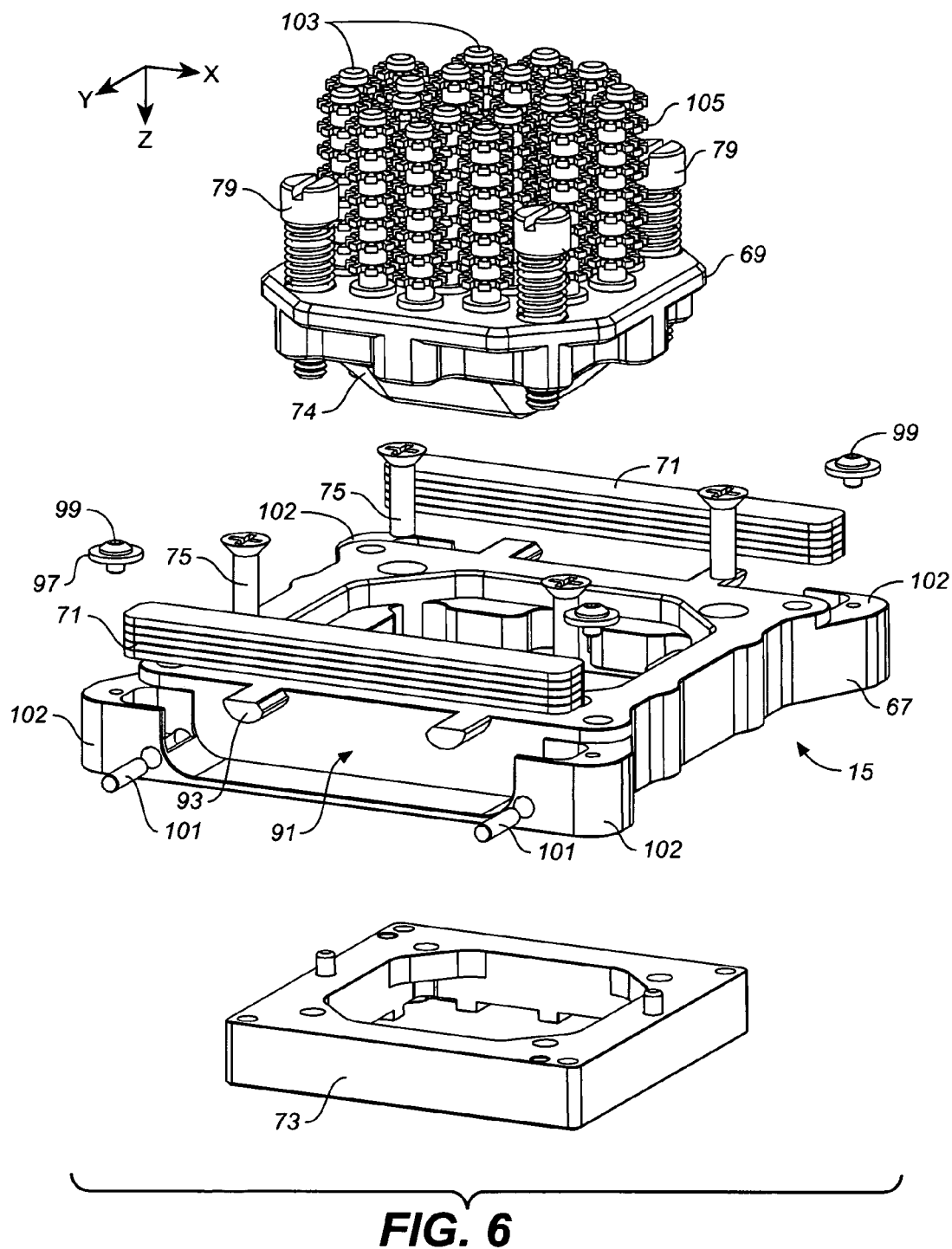
FIG. 6 is an exploded view of the pedestal assembly of the actuator cover assembly shown in the foregoing figures.
Figure 7:
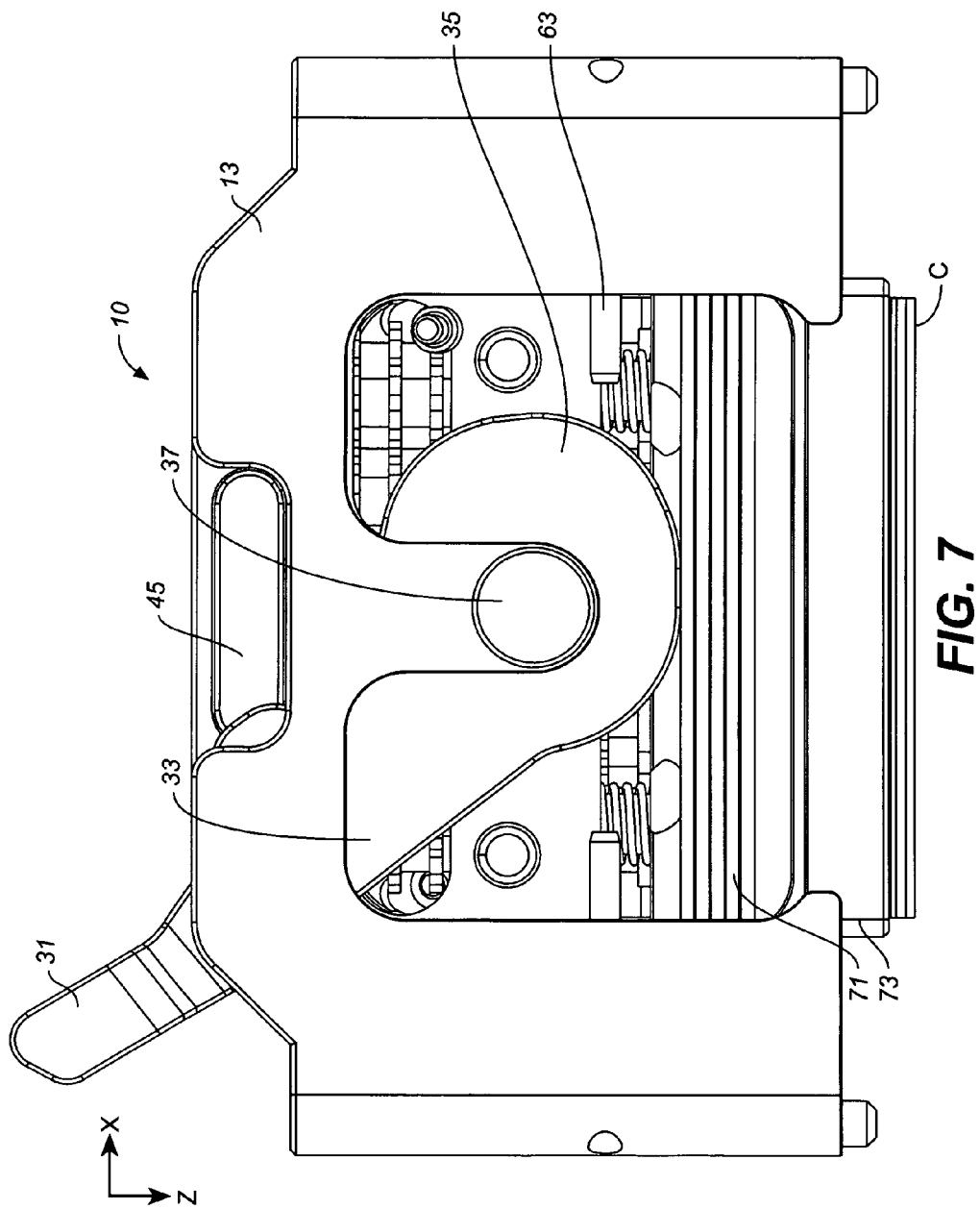
FIG. 7 is a side elevational view of the chip actuator cover assembly illustrated in FIGS. 1-5 showing the actuator mechanism in an open position.
Figure 7A:
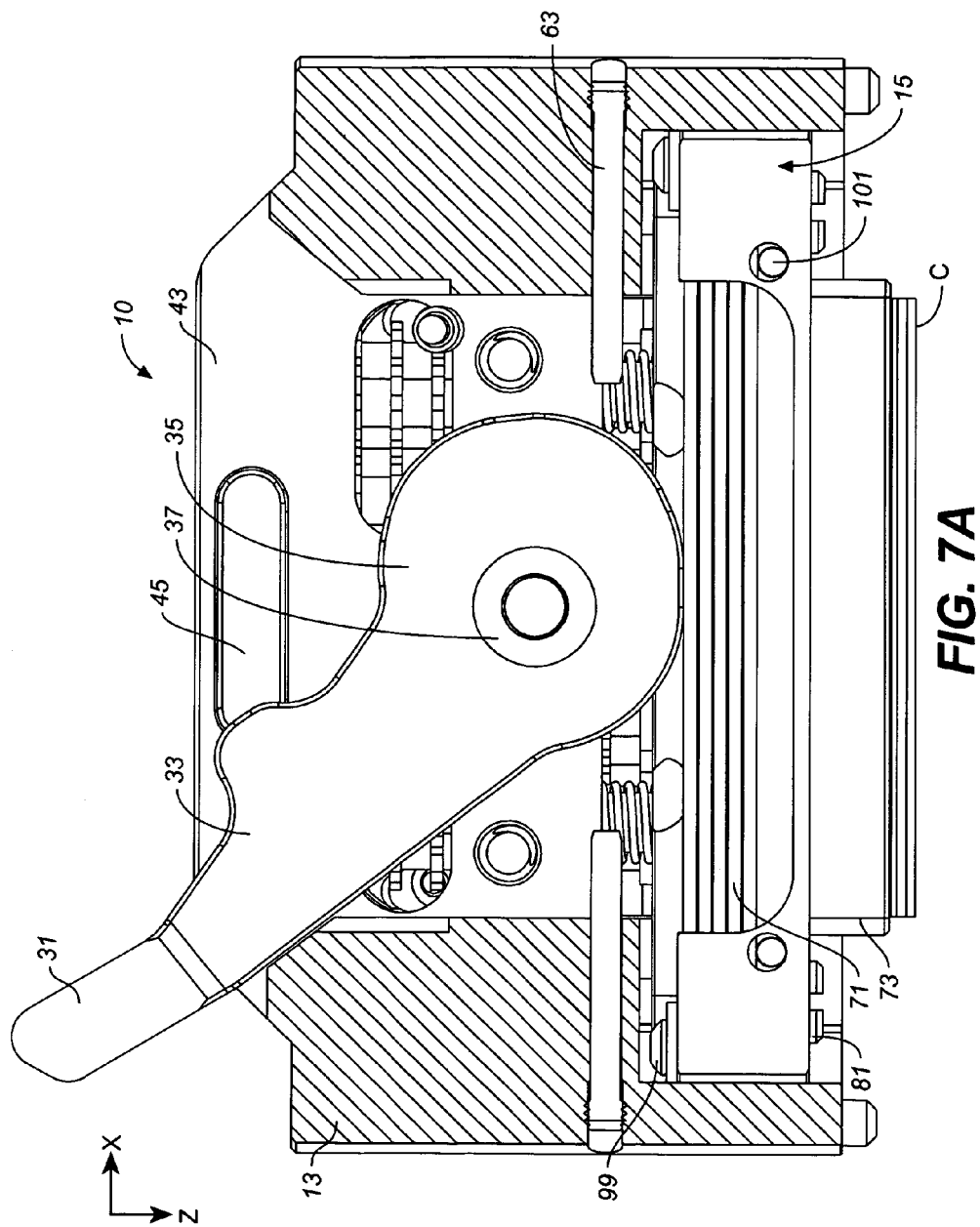
FIG. 7A is another side elevational view thereof showing the pedestal assembly and other parts not seen in FIG. 7.

As best seen in FIG. 5, the entire pedestal assembly is spring-mounted to the bottom of the carrier housing by means of shoulder screws 81, which slide through corner screw holes 83 in the outer frame of the pedestal assembly, and which screw into threaded holes in the bottom of inner corner bosses 85 of the carrier housing 13. As will be seen later in connection with the description of FIG. 16, the corner screw holes 83 have countersunk openings (not shown in FIG. 5) at the bottom of the of the outer frame to receive and capture compression springs 89. The biasing force of these compression springs against the bottom of outer pedestal frame will bias the entire pedestal assembly to its retracted position as shown in FIGS. 7 and 7A, until a z-axis actuating force is exerted on the leaf springs.

Figure 8:
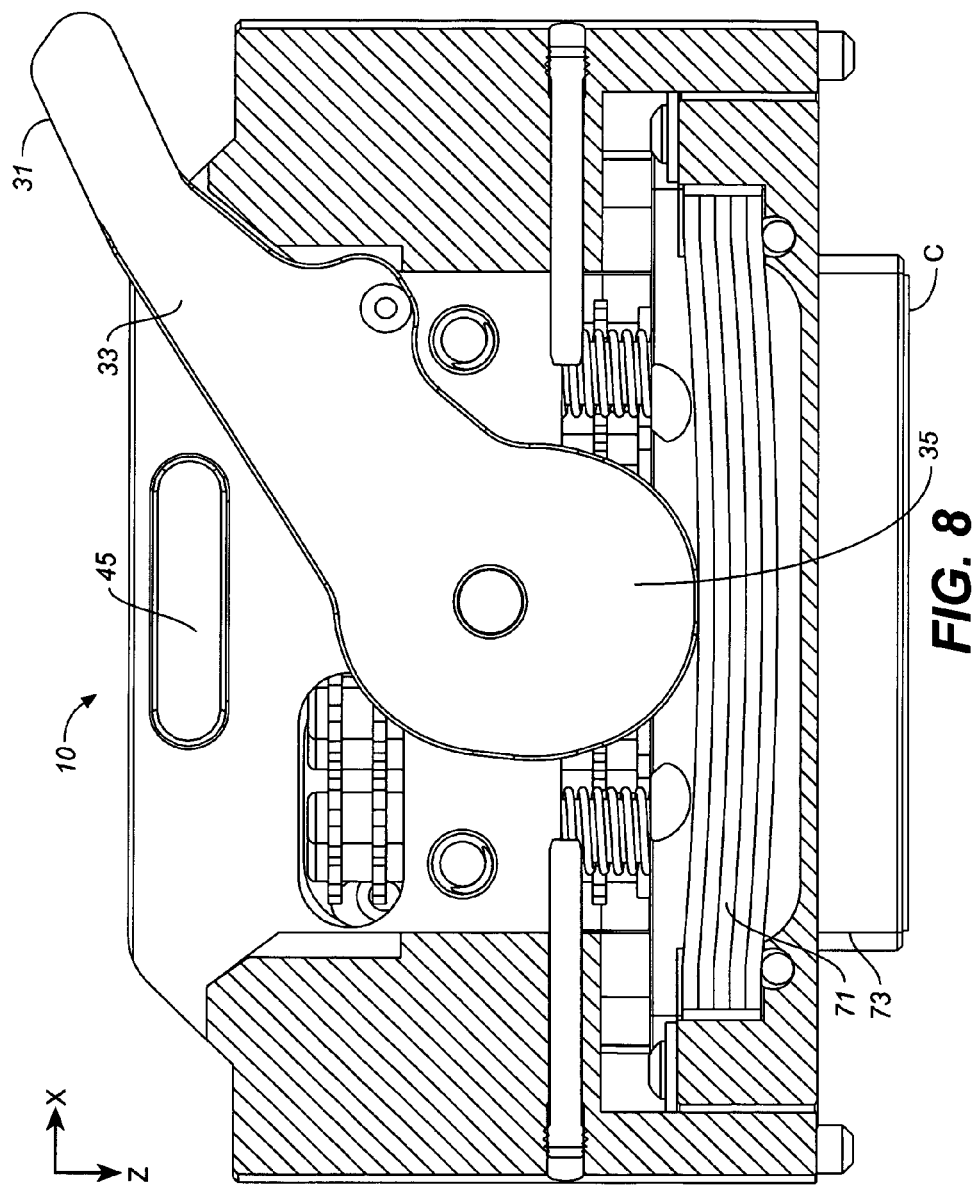
FIG. 8 is a cross-sectional view in side elevation of the chip actuator cover assembly illustrated in the foregoing figures with the actuator mechanism in a closed position.

The leaf springs 71 are seen to be made up of multiple leaves made of spring steel, the number and thickness of which can be chosen according to the desired actuating force. The springs are held in place in a capture structure in each side of the outer pedestal frame 67. Each of the capture structures is in the form of a spring channel 91 capped by transverse capping posts 93 extending from the frame's top edge 95. Corner washers 97 held in place by screws 99 retain the ends of the leaf springs, which are supported by bottom bearing surfaces in the form of bearing posts 101. When an actuating force is exerted on the top of the leaf springs as shown in FIG. 8, the force is transmitted to the bearing posts 101, and hence to the corner regions 102 of the pedestal assembly.

It is noted that the thickness and displacement of the capping posts 93 of the spring channel 91 can be chosen to pre-load the leaf springs. For example, for a contemplated deflection of the leaf springs of 50 mils, a pre-load deflection of about 25 mils could be provided by the capping posts.

It is further noted that the capture structure for the leaf springs could have any construction that suitably holds the leaf springs in place, and that provides a suitable bearing surface for the ends of the leaf springs. For example, rather than providing separate bearing posts 101, the bearing surfaces could be fabricated as an integral part of the outer pedestal frame.

It is seen that heat transfer away from the die of the IC package contacted by the pusher end of the pedestal heat sink is facilitated by a plurality of cooling pillars 103, which are affixed to the top of the heat pedestal heat sink and which extend into the center cavity region of the carrier housing. The cooling pillars are seen to suitably have a succession of radial fins 105 for increasing the surface area of the pillars. The pillars and the pedestal heat sink are suitably fabricated of heat conductive material, with the pedestal heat sink suitably being fabricated of a nickel-plated copper.

As to the other components of the chip actuator cover assembly, the carrier housing 13, actuator handle and connecting arms 31, 33, and outer pedestal frame 15 are suitably fabricated of aluminum, and the pusher frame affixed to the bottom of the outer pedestal frame is suitably fabricated of plastic.

To use the above-described IC chip actuator and cover assembly, for example for testing an IC chip (device under test or DUT), the DUT is placed in a test socket for which the actuator cover assembly was designed and the bottom of the carrier housing is placed over the top of the test socket, so that the lower ends 57 of side clips 55 snap onto the socket. This is done with the actuator mechanism 11 in the open position where there is no deflection of the side leaf springs 71. Once in place, the handle of the actuator mechanism is moved from the open to the closed position to deflect the leaf springs, as illustrated in FIG. 8.

Turning to the embodiment of the invention designed for use with an IHS test chip package, the general profile of such a chip package is graphically illustrated in FIG. 11, wherein a relatively bulky heat spreader H of the chip (denoted by the letter C) is mounted on top of substrate S. Because of the dimensions of the heat spreader relative to the substrate, an actuation force is supplied to the top of the heat spreader only, and not to the substrate. Consequently, in the chip actuator cover assembly of the invention, there is no need for a second pusher frame, such as pusher frame 73 described above.

FIGS. 12-17 illustrate a chip actuator cover assembly in accordance with the invention, generally denoted by the numeral 107, for use with an IHS chip package. As with the prior version, the carrier housing 109 for the actuator mechanism 111 carries a pedestal assembly 113, which is spring-mounted to the bottom of the carrier housing in a manner similar to that previously described. In this version, the pedestal assembly includes pedestal heat sink 115 having a bottom pusher end 117, but no pusher frame. The pusher assembly is actuated in the z-axis direction in the same manner as the previous invention by moving the handle of the actuator mechanism from an open to a closed position to cause the cam discs 119 of the actuator mechanism to exert a z-axis force against leaf springs 121. As with the previous embodiment, this actuating force is transmitted to the corner regions of the pedestal assembly, causing the pusher end 117 of pedestal heat sink 115 to advance against the top of the heat spreader of the IC chip. This advancement is generally illustrated in FIGS. 12-16, wherein the pusher end of the pedestal heat sink is shown as advancing from a retracted position in FIGS. 12 and 13 to an actuating position shown in FIGS. 14 and 15, where the pusher end contacts the top of the heat spreader H of IC chip C.

In a manner similar to the previously described embodiment, heat transfer from the spreader H of the IC package contacted by the pusher end of the pedestal heat sink 115 is facilitated by a plurality of cooling pillars 116, which are affixed to the top of the heat pedestal heat sink.

Figure 16:
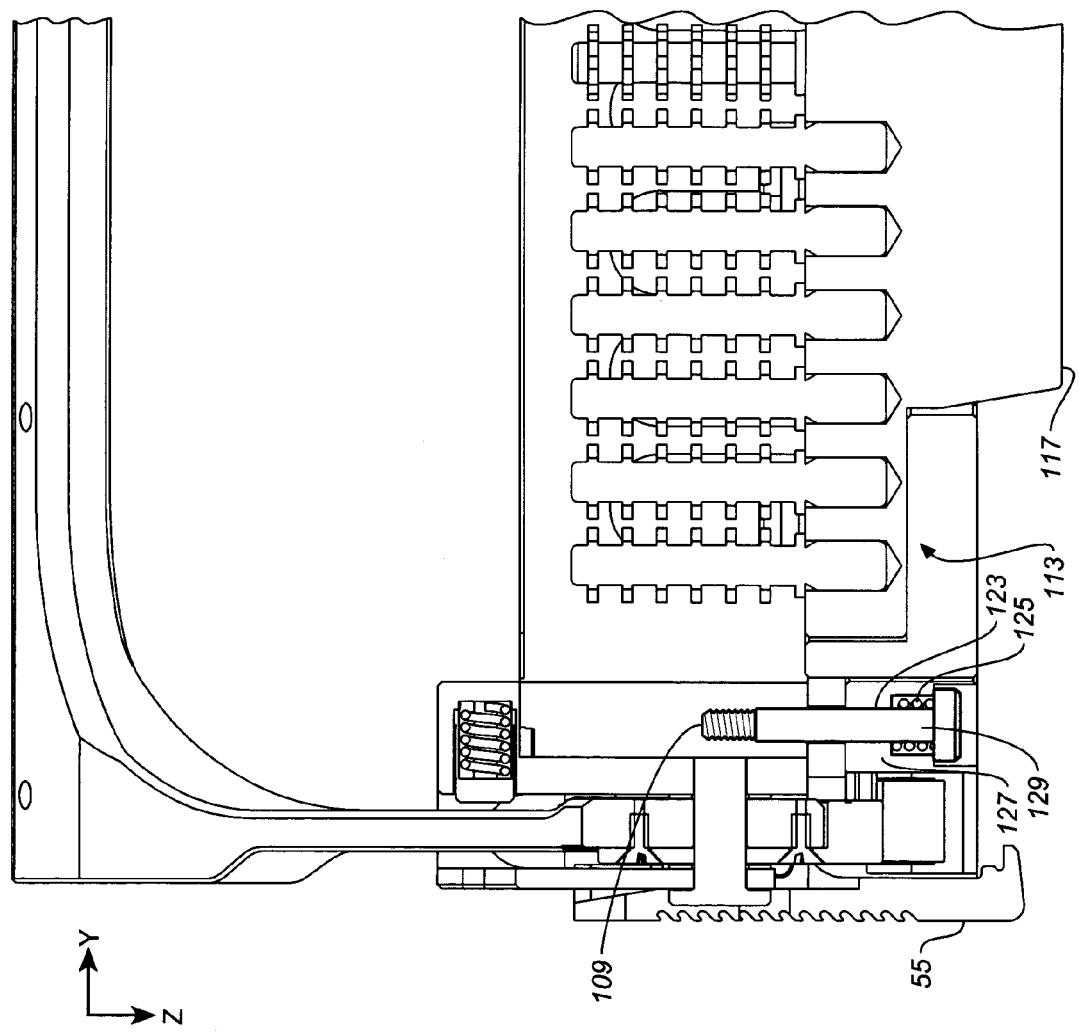
FIG. 16 is a fragmentary cross-sectional view thereof showing in greater detail the spring mounting of the pedestal assembly to the bottom of the carrier housing.
Figure 17:
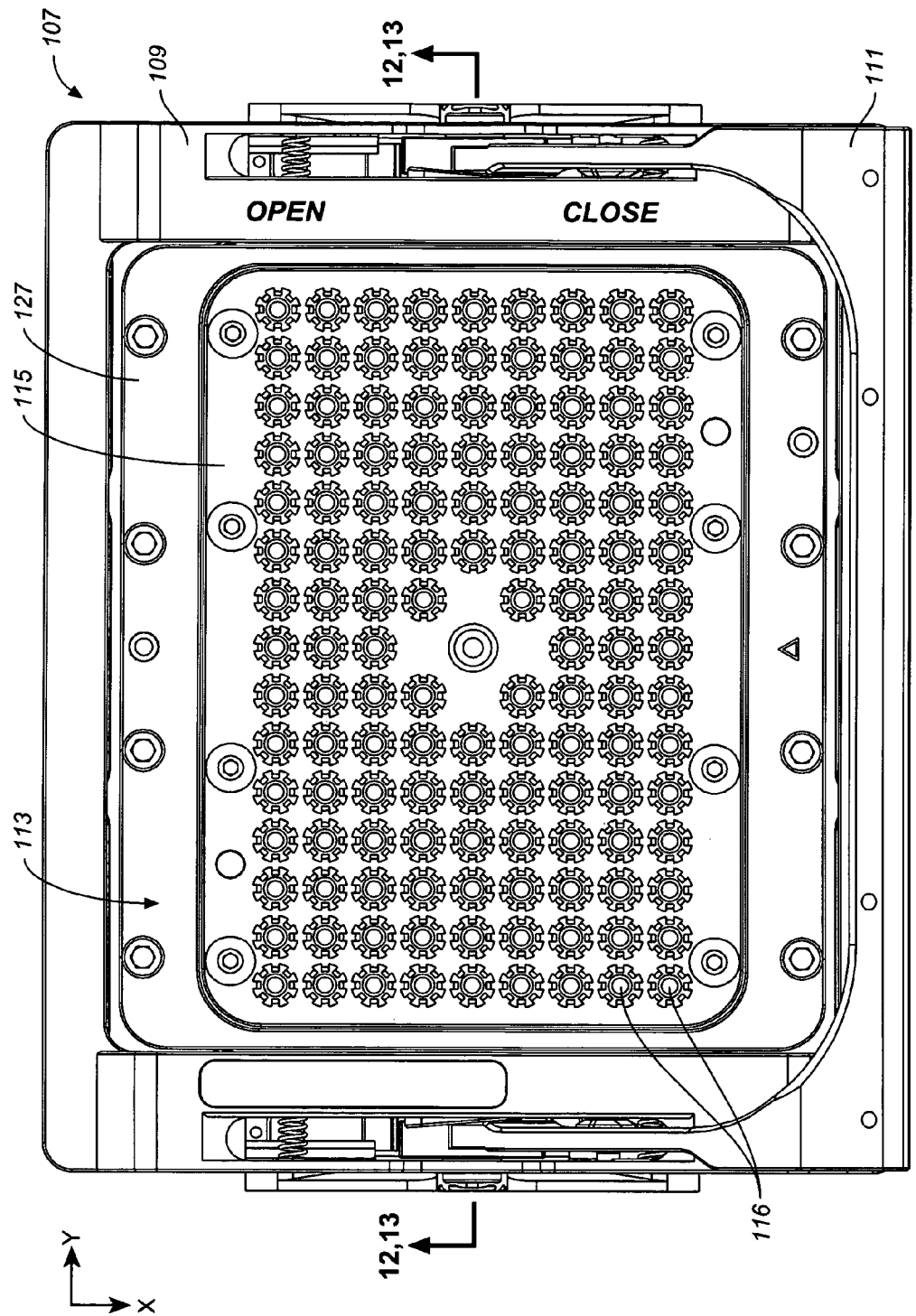
FIG. 17 is a top plan view thereof.

FIG. 16 shows in yet greater detail the spring-mounting of the pedestal assembly 113 to carrier housing 109 by use of shoulder screws 123, which are the same as the shoulder screws 81 in the embodiment of FIGS. 1-9A. Each of the corner screw holes for the shoulder screws have counter openings 125 at the bottom of the outer pedestal frame 127 to receive and capture compression springs 129. The biasing force of the compression springs, which acts against the bottom of the outer pedestal frame, will bias the entire pedestal assembly to its shown retracted position until a z-axis actuating force is exerted on the leaf springs.

It shall be understood that, while the present invention is described in considerable detail in the foregoing specification and accompanying drawings, it is not intended that the scope of the invention be limited to such detail except and to the extent necessitated by the following claims.

What we claim is:

1. An improved IC chip actuator cover assembly for an IC socket comprising
   an actuator mechanism having actuating members for producing an actuating force,
   a carrier housing for holding said actuator mechanism, said carrier housing having a top end, a bottom end, a front, a back, and sides extending between said top and bottom ends, and further having a defined actuating z-axis extending through the bottom end thereof, the actuating members of said actuator mechanism being deployed at the sides of said carrier housing, and said carrier housing being releasably attachable to an IC socket, and
   a pedestal assembly mounted to the bottom end of said carrier housing so as to be movable relative to said carrier housing in the actuating z-axis direction from a retracted position to an advanced actuating position, said pedestal assembly having corner regions and a bottom pusher end within said corner regions for contacting an IC device placed in the IC socket to which the carrier housing is attached,
   said pedestal assembly including leaf springs extending between opposed corner regions of said pedestal assembly and being deployed beneath the actuating members of said actuator mechanism held in the carrier housing such that, when an actuating force is produced by the actuating members, a z-axis direction force is exerted against said leaf springs and transferred by said leaf springs to the corner regions of the pedestal assembly.

2. The improved IC chip actuator cover assembly of claim 1 wherein the front, back and sides of said carrier housing define a central cavity region above said pedestal assembly for providing cooling to the pedestal assembly.

3. The improved IC chip actuator cover assembly of claim 2 wherein said pedestal assembly has a top end above said bottom pusher end and at least one cooling pillar extending upwardly from said top end into the open cavity region of said carrier housing, and wherein at least the portion of the pedestal assembly between the bottom pusher end and the top end from which the at least one cooling pillar extends is heat conductive.

4. The improved IC chip actuator cover assembly of claim 3 wherein a plurality of cooling pillars extend upwardly from the top end of said pedestal assembly.

5. The improved IC chip actuator cover assembly of claim 3 wherein the front and back of the carrier housing have air flow openings to increase air flow through said open cavity region.

6. The improved IC chip actuator cover assembly of claim 1 wherein said pedestal assembly includes side edges beneath the sides of said carrier housing and a leaf spring capture structure in each of said side edges which allows the actuating members of said actuator mechanism to press against said leaf springs for transmitting z-axis direction forces to the corner regions of said pedestal assembly.

7. The improved IC chip actuator cover assembly of claim 6 wherein said leaf springs have end portions, and wherein said leaf spring capture structure includes a transverse bearing surface in each corner region of said pedestal assembly, each said bearing surface being contacted by the end portions of the leaf spring to maintain a z-axis direction force at each corner region of the pedestal assembly when an actuating force is exerted on the leaf springs by the actuating members of said actuator mechanism.

8. The improved IC chip actuator cover assembly of claim 7 wherein each of said bearing surfaces is provided by a transverse bearing pin.

9. The improved IC chip actuator cover assembly of claim 1 wherein the actuating members of said actuator mechanism are cam actuating members, and wherein said cam actuating members can be rotated against said leaf springs for exerting an actuating z-axis direction force thereagainst.

10. The improved IC chip actuator cover assembly of claim 9 wherein said actuator mechanism includes an accessible actuator handle extending above the top of said carrier housing, said actuator handle being movable from the front to the back of the carrier housing to rotating said cam actuator members.

11. The improved IC chip actuator cover assembly of claim 10 further comprising a breaking mechanism in said carrier housing for impeding the movement of said actuator handle to prevent backlash of the handle.

12. The improved IC chip actuator cover assembly of claim 1 wherein said pedestal assembly has an outer pedestal frame structure and an inner pedestal heat sink, the bottom pusher end of said pedestal assembly being at least in part provided on said inner pedestal heat sink.

13. The improved IC chip actuator cover assembly of claim 12 wherein said pedestal heat sink is spring-mounted to said outer pedestal frame to permit the z-axis reactive force exerted by a contacted IC chip to be taken up by the pedestal heat sink.

14. The improved IC chip actuator cover assembly of claim 1 wherein spring clips having downwardly extending clip ends are provided on the sides of the carrier housing for releasably attaching the carrier housing to an IC test socket.

15. An improved IC chip actuator cover assembly for an IC socket comprising
a carrier housing having a top end, a bottom end, a front, a back, and opposed sides extending between said top and bottom ends, and further having an z-axis extending through its bottom end, and said carrier housing being releasably attachable to an IC socket,
a pedestal assembly spring mounted to the bottom end of said carrier housing so as to be movable relative to said carrier housing in the z-axis direction from a retracted position to an advanced actuating position, said pedestal assembly having corner regions and a bottom pusher end within said corner regions for contacting an IC device placed in the socket to which the carrier housing is attached,
an actuator mechanism carried on said carrier housing, said actuator mechanism having actuating members for exerting a downward actuating force on said pedestal assembly in the z-axis direction,
spring means on said pedestal assembly for receiving the downward actuating force exerted by the actuating members of said actuator mechanism and for transferring such actuating force to laterally displaced locations within said pedestal assembly such that laterally displaced downward z-axis direction forces are produced on said pedestal assembly by said spring means to advance said pedestal assembly in the z-axis direction from its retracted position to its actuating position.

16. The improved IC chip actuator cover assembly of claim 15 wherein said pedestal assembly includes side edges deployed beneath the sides of said carrier housing and wherein the spring means on said pedestal assembly for receiving the actuating force exerted by the actuating members of said actuator mechanism are deployed in the side edges of said pedestal assembly.

17. The improved IC chip actuator cover assembly of claim 15 wherein said pedestal assembly includes and outer frame and a pedestal heat sink fabricated of a heat conductive material supported in said out frame, said pedestal heat sink having a bottom pusher end, and wherein the spring means for receiving the actuating force exerted by the actuating members of said actuator mechanism is provided in the outer frame of said pedestal assembly.

18. The improved IC chip actuator cover assembly of claim 17 wherein the spring means on said pedestal assembly for receiving the actuating force exerted by the actuating members of said actuator mechanism include leaf springs and wherein said leaf springs are captured in the outer frame of said pedestal assembly.

19. The improved IC chip actuator cover assembly of claim 18 wherein means are provided on the outer frame of said pedestal assembly for preloading said leaf springs.

20. The improved IC chip actuator cover assembly of claim 17 wherein said pedestal heat sink has a top end above the bottom pusher end thereof, and wherein at least one cooling pillar extends upwardly from the top end for dissipating heat from said pedestal heat sink.

21. The improved IC chip actuator cover assembly of claim 20 wherein a plurality of cooling pillars extend upwardly from the top end of said pedestal heat sink.

22. An improved IC chip actuator cover assembly for an IC socket comprising
an actuator mechanism having actuating members for producing an actuating force,
a carrier housing for holding said actuator mechanism, said carrier housing having a top end, a bottom end, a front, a back, and sides extending between said top and bottom ends to form a central cavity region through which a flow of air can be achieved, the actuating members of said actuator mechanism being deployed at the sides of said carrier housing, and said carrier housing being releasably attachable to an IC socket, and a pedestal assembly mounted to the bottom end of said carrier housing so as to be movable relative to said carrier housing in an actuating z-axis direction from a retracted position to an advanced actuating position, said pedestal assembly having corner regions and a pedestal heat sink within said corner regions for contacting an IC device placed in the IC socket to which the carrier housing is attached, said pedestal heat sink having a top end through which heat produced by the contacted IC device can be transferred into the central cavity region of the carrier housing, said pedestal assembly including leaf springs extending between opposed corner regions of said pedestal assembly and being deployed beneath the actuating members of said actuator mechanism held in the carrier housing such that, when an actuating force is produced by the actuating members, a z-axis direction force is exerted against said leaf springs and transferred by said leaf springs to the corner regions of the pedestal assembly.

23. The improved IC chip actuator cover assembly of claim 22 wherein at least one cooling pillar extends upwardly from the top end of said pedestal assembly heat sink into the central cavity region of the carrier housing.

24. The improved IC chip actuator cover assembly of claim 22 wherein the front and back of the carrier housing have air flow openings to increase air flow through said open cavity region.

25. An improved IC chip actuator cover assembly for an IC socket comprising an actuator mechanism having actuating members for producing an actuating force, a carrier housing for holding said actuator mechanism, said carrier housing having a top end, a bottom end, a front, a back, and opposed sides extending between said top and bottom ends, and further having a defined actuating z-axis extending through the bottom end thereof, the actuating members of said actuator mechanism being deployed at the sides of said carrier housing, and said carrier housing being releasably attachable to an IC socket, and a pedestal assembly mounted to the bottom end of said carrier housing so as to be movable relative to said carrier housing in the actuating z-axis direction from a retracted position to an advanced actuating position, said pedestal assembly having a bottom pusher end for contacting an IC device placed in the IC socket to which the carrier housing is attached, said pedestal assembly including leaf springs deployed beneath the actuating members of the actuator mechanism held in said carrier housing, wherein, when actuated, the actuating members of said actuator mechanism produce an actuating force against said leaf springs, said leaf springs being deployed in said pedestal assembly so as to transfer the actuating force from the actuating members of the actuator mechanism to points about said pedestal assembly for producing balanced and compliant z-axis direction forces on said pedestal assembly, which advance said pedestal assembly in the z-axis direction from its retracted position to its actuating position.

26. The improved IC chip actuator cover assembly of claim 25 wherein the front, back and sides of said carrier housing define a central cavity region above said pedestal assembly for providing cooling to the pedestal assembly, and wherein said leaf springs are deployed on opposite sides of said central cavity region.

27. The improved IC chip actuator cover assembly of claim 26 wherein said pedestal assembly has a top end above said bottom pusher end and at least one cooling pillar extending upwardly from said top end into the open cavity region of said carrier housing, and wherein at least the portion of the pedestal assembly between the bottom pusher end and the top end from which the at least one cooling pillar extends is heat conductive.

28. The improved IC chip actuator cover assembly of claim 27 wherein a plurality of cooling pillars extend upwardly from the top end of said pedestal assembly.

29. The improved IC chip actuator cover assembly of claim 27 wherein the front and back of the carrier housing have air flow openings to increase air flow through said open cavity region.

* * * * *

UNITED STATES PATENT AND TRADEMARK OFFICE
CERTIFICATE OF CORRECTION

PATENT NO. : 7,651,340 B2
APPLICATION NO. : 12/072121
DATED : January 26, 2010
INVENTOR(S) : Nasser Barabi, Oksana Kryachek and Chee-Wah Ho Page 1 of 1

It is certified that error appears in the above-identified patent and that said Letters Patent is hereby corrected as shown below:

In column 1, line 8, "entirely" should read --entirety--.
In column 4, line 7, "of the" should be deleted between "on the" and "connector".
In column 4, line 60, "of the" should be deleted between "of the" and "outer".
In column 4, line 62, "of outer" should read --of the outer--.
In column 7, line 31, "each said bearing surface" should read --each of said bearing surfaces--.
In column 8, line 37, "and outer" should read --an outer--.
In column 8, line 39, "out frame" should read --outer frame--.

Signed and Sealed this
Eighth Day of November, 2011

David J. Kappos
*Director of the United States Patent and Trademark Office*